US011574667B2

(12) United States Patent
Safranski et al.

(10) Patent No.: US 11,574,667 B2
(45) Date of Patent: Feb. 7, 2023

(54) RESONANT SYNTHETIC ANTIFERROMAGNET REFERENCE LAYERED STRUCTURE

(71) Applicant: International Business Machines Corporation, Armonk, NY (US)

(72) Inventors: Christopher Safranski, Yorktown Heights, NY (US); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 16/950,345

(22) Filed: Nov. 17, 2020

(65) Prior Publication Data

US 2022/0157358 A1 May 19, 2022

(51) Int. Cl.

| | |
|---|---|
| ***G11C 11/16*** | (2006.01) |
| ***H01L 43/08*** | (2006.01) |
| ***H01F 10/32*** | (2006.01) |
| ***H01L 43/10*** | (2006.01) |
| ***H01L 43/02*** | (2006.01) |

(52) U.S. Cl.

CPC ........ *G11C 11/161* (2013.01); *H01F 10/3272* (2013.01); *H01F 10/3286* (2013.01); *H01L 43/02* (2013.01); *H01L 43/08* (2013.01); *H01L 43/10* (2013.01)

(58) Field of Classification Search

CPC ....... G11C 11/161; H01L 43/02; H01L 43/08; H01L 43/10; H01F 10/3272; H01F 10/3286

USPC ........................................................ 257/421

See application file for complete search history.

(56) References Cited

U.S. PATENT DOCUMENTS

| | | | | |
|---|---|---|---|---|
| 9,171,601 | B2 * | 10/2015 | Shukh | G11C 11/1675 |
| 10,460,786 | B2 | 10/2019 | Lee et al. | |

(Continued)

FOREIGN PATENT DOCUMENTS

| | | | |
|---|---|---|---|
| CN | 103545443 | A | 1/2014 |
| CN | 110476264 | A | 11/2019 |
| CN | 111640858 | A | 9/2020 |

OTHER PUBLICATIONS

International Search Report dated Feb. 10, 2022 received in a corresponding foreign application, 11 pages.

(Continued)

*Primary Examiner* — Jami Valentine Miller

(74) *Attorney, Agent, or Firm* — Scully, Scott, Murphy & Presser, P.C; Daniel P. Morris, Esq.

(57) ABSTRACT

A magnetic memory device including a magnetic tunnel junction (MTJ) pillar containing a stable resonant synthetic antiferromagnet (SAF) reference layered structure in which the ferromagnetic resonance characteristics of a polarizing magnetic layer of the SAF reference layered structure are substantially matched to at least a first magnetic reference layer within the SAF reference layered structure. By substantially matching the ferromagnetic resonance characteristics of the polarizing magnetic layer to at least the first magnetic reference layer, a MTJ pillar is provided in which the dynamic stability of the polarizing magnetic layer can be improved, and undesirable magnetic reference layer instability related write-errors can be mitigated.

20 Claims, 4 Drawing Sheets

24
22
20
18
16
14
12
10

(56) References Cited

U.S. PATENT DOCUMENTS

| | | | | |
|---|---|---|---|---|
| 2004/0061981 | A1* | 4/2004 | Covington | H01F 41/325 360/324.1 |
| 2010/0034017 | A1 | 2/2010 | Rivkin et al. | |
| 2012/0267735 | A1 | 10/2012 | Atulasimha et al. | |
| 2016/0104544 | A1* | 4/2016 | Schafer | G01R 33/098 374/141 |
| 2018/0248110 | A1* | 8/2018 | Kardasz | H01L 43/10 |
| 2019/0165255 | A1* | 5/2019 | Zhu | G11C 11/161 |
| 2022/0157358 | A1* | 5/2022 | Safranski | H01L 43/02 |
| 2022/0278270 | A1* | 9/2022 | Guo | H01L 43/02 |

OTHER PUBLICATIONS

Safranski, C., et al., “Interface moment dynamics and its contribution to spin-transfer torque switching process in magnetic tunnel junctions”, Physical Review B, Jul. 26, 2019, pp. 014435-1 to 014435-9, 100.

Lan, D., et al., “Tuning antiferromagnetic interlayer exchange coupling in La0.61Ca0.33MnO3-based synthetic antiferromagnets”, APL Materials, Mar. 29, 2019, pp. 031119-1 to 031119-8, 7.

Duine, R. A., et al., “Synthetic Antiferromagnetic Spintronics”, Nat Phys., Mar. 2018; 9 pages, 14(3): 217-219.

Sbiaa, R., et al., “Materials with perpendicular magnetic anisotropy for magnetic random access memory”, Phys. Status Solidi RRL, Sep. 26, 2011, pp. 413-419, 5, No. 12.

* cited by examiner

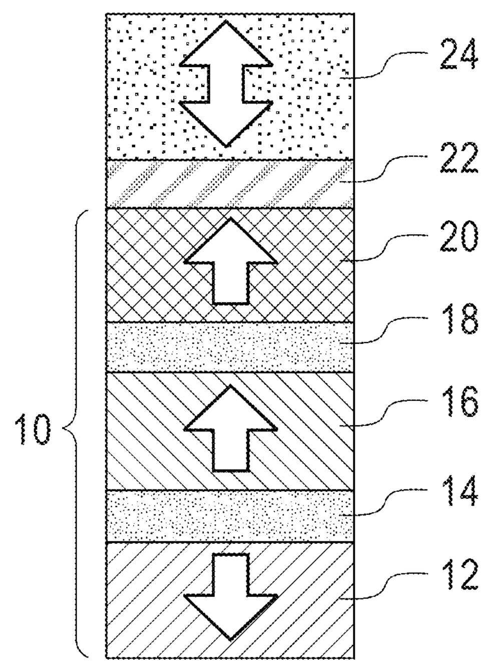
FIG. 1A
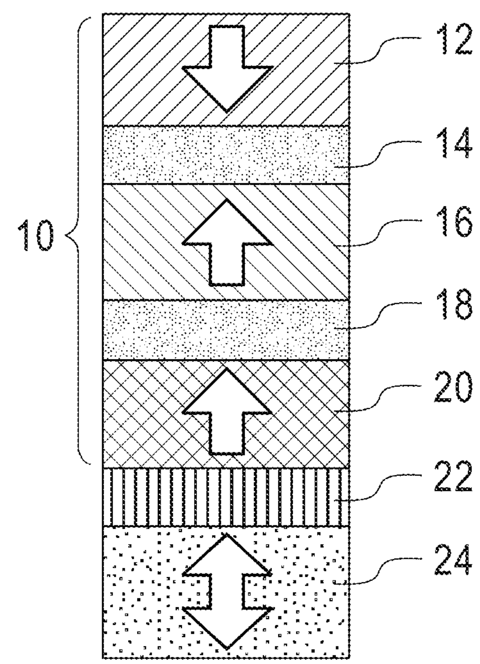
FIG. 1B
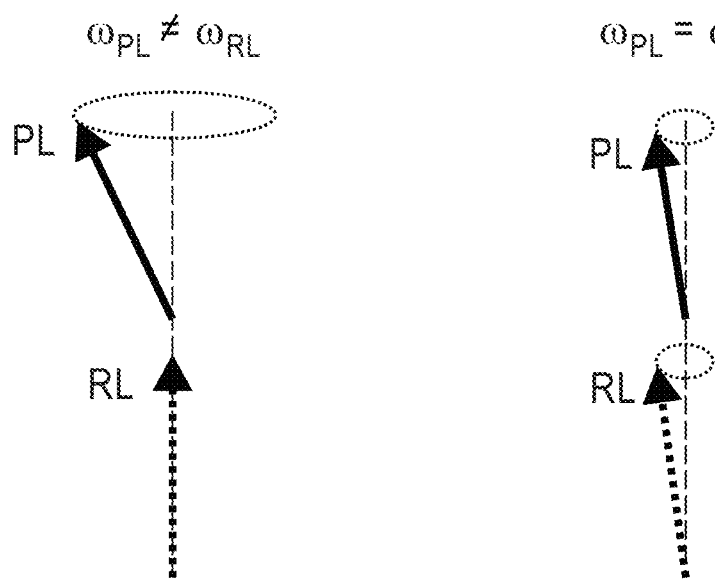
FIG. 2A
(Prior Art)
FIG. 2B

RESONANT SYNTHETIC ANTIFERROMAGNET REFERENCE LAYERED STRUCTURE

BACKGROUND

The present application relates to magnetic memory, and more particularly to a magnetic memory device including a magnetic tunnel junction (MTJ) pillar having a stable resonant synthetic antiferromagnet (SAF) reference layered structure.

Magnetic tunnel junction (MTJ) pillars are a potential candidate for non-volatile memory applications. Devices that include a MTJ pillar store information on the magnetization of a magnetic free layer. Switching and reading of the state is achieved by passing a current through a MTJ pillar containing a magnetic free layer, a tunnel barrier layer and a polarizing magnetic layer. The larger the applied current, the faster the bit switches. However, if the write current is too high, the polarizing magnetic layer can switch as well, causing a "flip-flop" motion between the magnetic free layer and the top of the polarizing magnetic layer, and resulting in write errors.

To stabilize the polarizing magnetic layer, the polarizing magnetic layer is exchange coupled to a stack of magnetic reference layers with high anisotropy to try and support the polarizing magnetic layer; such a structure can be referred to as a synthetic antiferromagnet (SAF) reference layered structure. Under static tests, such a structure can increase the stability. However, dynamically under the application of large spin-current (the MTJ pillar being biased at a high-voltage, for example), the prior SAF reference layered structure designs often localize oscillations resulting from the undesirable spin-current excitation of the magnetic reference layer to the polarizing magnetic layer only.

SUMMARY

A magnetic memory device is provided that includes a magnetic tunnel junction (MTJ) pillar containing a stable resonant synthetic antiferromagnet (SAF) reference layered structure in which the ferromagnetic resonance characteristics of a polarizing magnetic layer of the SAF reference layered structure are substantially matched to at least a first magnetic reference layer within the SAF reference layered structure. The "first magnetic reference layer" of the SAF reference layered structure is the magnetic reference layer that is directly coupled, via a first coupling layer, to the polarizing magnetic layer. By substantially matching the ferromagnetic resonance characteristics of the polarizing magnetic layer to at least the first magnetic reference layer, a MTJ pillar is provided in which the dynamic stability of the polarizing magnetic layer can be improved, and undesirable magnetic reference layer instability related write-errors can be mitigated.

In one embodiment, the magnetic memory device of the present application includes a MTJ pillar including a tunneling barrier layer sandwiched between a synthetic antiferromagnet (SAF) reference layered structure, and a magnetic free layer. The SAF reference layered structure includes a polarizing magnetic layer exchange coupled to a stack of magnetic reference layers including a first magnetic reference layer and a second magnetic reference layer. The polarizing magnetic layer forms an interface with the tunnel barrier layer and it has a resonance frequency peak that substantially overlaps a resonance frequency peak of at least the first magnetic reference layer. In some embodiments, the resonance frequency peak of the polarizing magnetic layer can overlap the resonance frequency peaks of both the first and second magnetic reference layers.

In another embodiment, the magnetic memory device of the present application includes a MTJ pillar including a tunneling barrier layer sandwiched between a synthetic antiferromagnet (SAF) reference layered structure, and a magnetic free layer. The SAF reference layered structure includes a polarizing magnetic layer exchange coupled to a stack of magnetic reference layers including a first magnetic reference layer and a second magnetic reference layer. In accordance with the present application, both the polarizing magnetic layer and the first magnetic reference layer have spin-current excitations present therein. In some embodiments, the polarizing magnetic layer and the first and second magnetic reference layers all have spin-current excitations present therein.

In either embodiment of the present application, the first magnetic reference layer is antiferromagnetically exchange coupled to the second magnetic reference layer. In the present application, a first coupling layer separates the polarizing magnetic layer from the first magnetic reference layer, and a second coupling layer separates the first magnetic reference layer from the second magnetic reference layer.

In some embodiments, the MTJ pillar is a top pinned MTJ pillar having the magnetic free layer located above the SAF reference layered structure, while in other embodiments, the MTJ pillar is a bottom pinned MTJ pillar having the magnetic free layer located beneath the SAF reference layered structure.

In some embodiments of the present application, the polarizing magnetic layer is composed of an alloy of cobalt-iron-boron (Co—Fe—B), an alloy of cobalt-iron (Co—Fe), iron (Fe), cobalt (Co) or multilayered stacks thereof, and has a thickness from 0.5 nm to 3 nm. In some instances, the polarizing magnetic layer has a perpendicular anisotropy, $H_k$, from −1 kOe to 10 kOe.

In some embodiments of the present application, the first magnetic reference layer and the second magnetic reference layer are composed of cobalt/nickel (Co/Ni), cobalt/platinum (Co/Pt), cobalt/palladium (Co/Pd), cobalt (Co), nickel (Ni), platinum (Pt), palladium (Pd) or multilayered stacks thereof, and have a thickness from 0.2 nm to 1 nm. In some instances, the first magnetic reference layer has a perpendicular anisotropy, $H_k$, from 0 kOe to 10 kOe, and the perpendicular anisotropy of the first magnetic reference layer substantially matches the perpendicular anisotropy of the polarizing magnetic layer.

In some embodiments, and to increase overlap of the resonance frequency peaks of the polarizing magnetic layer and the first magnetic reference layer, the first magnetic reference layer includes a rare-earth element inserted therein. In such an embodiment, the first magnetic reference layer containing the rare-earth element insertion has a damping value, $\alpha$, of from 0.0001 to 1.

BRIEF DESCRIPTION OF THE DRAWINGS

FIG. 1A is cross sectional view of a MTJ pillar in accordance with an embodiment of the present application.

FIG. 1B is cross sectional view of a MTJ pillar in accordance with another embodiment of the present application.

FIG. 2A shows the magnetic moment vector processing around the rest state axis when the resonance frequency of the polarizing magnetic layer ($\omega_{PL}$) is not equal to the resonance frequency of the first magnetic reference layer ($\omega_{RL}$).

FIG. 2B shows the magnetic moment vector processing around the rest state axis when the resonance frequency of the polarizing magnetic layer ($\omega_{PL}$) is substantially equal to the resonance frequency of the first magnetic reference layer ($\omega_{RL}$).

DETAILED DESCRIPTION

Figure 3A:
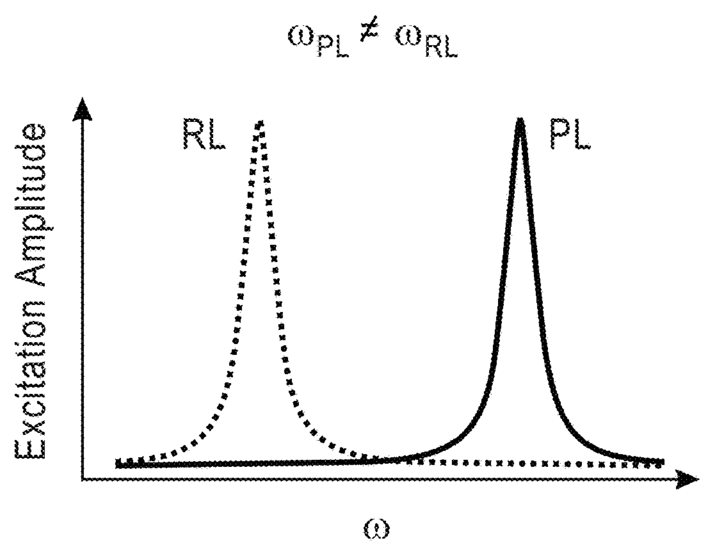
FIG. 3A is a graph of excitation amplitude vs. frequency ($\omega$) when the resonance frequency of the polarizing magnetic layer ($\omega_{PL}$) is not equal to the resonance frequency of the first magnetic reference layer ($\omega_{RL}$).

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated previously, the present application provides a magnetic memory device such as, for example, a magnetoresistive random access memory (MRAM), including a MTJ pillar containing a stable resonant SAF reference layered structure in which the ferromagnetic resonance characteristics of a polarizing magnetic layer of the SAF reference layered structure are substantially matched to at least a first magnetic reference layer within the SAF reference layered structure. The "first magnetic reference layer" of the SAF reference layered structure is the magnetic reference layer that is directly coupled, via a first coupling layer, to the polarizing magnetic layer. By substantially matching the ferromagnetic resonance characteristics of the polarizing layer to the at least the first magnetic reference layer, a MTJ pillar is provided in which the dynamic stability of the polarizing magnetic layer can be improved, and undesirable magnetic reference layer instability related write-errors can be mitigated. Notably, when the layers of such a stable resonant SAF reference layered structure resonate, energy can be draw away from the polarizing magnetic layer which, in turn, can mitigate and, in some instances, even eliminate write errors.

Reference is first made to FIGS. 1A-1B which illustrate various MTJ pillars in accordance with different embodiments of the present invention. The MTJ pillar shown in FIG. 1A can be referred to a bottom pinned MTJ pillar, while the MTJ pillar shown in FIG. 1B can be referred to as a top pinned MTJ pillar.

Each MTJ pillar shown in FIGS. 1A-1B includes a magnetic free layer 24, a tunnel barrier layer 22 and a stable resonant SAF reference layered structure 10. By "stable resonant SAF reference layered structure" it is meant that the SAF reference layered structure is designed such that the ferromagnetic resonance characteristics of a polarizing magnetic layer of the stable resonant SAF reference layered structure are substantially matched to at least the first magnetic reference layer within the stable resonant SAF reference layered structure 10. In some embodiments, the ferromagnetic resonance characteristics of the polarizing magnetic layer of the stable resonant SAF reference layered structure are substantially matched to each of the magnetic reference layers present in the SAF reference layered structure 10. In the present application, the SAF reference layered structure is designed such that the resonance frequency peak of the polarizing magnetic layer substantially overlaps a resonance frequency peak of at least the first magnetic reference layer of the SAF reference layered structure. Resonance frequency peaks can be determined by magnetization, shape, anisotropy fields, and internal magnetic fields. Substantially overlapping resonance frequency peaks are those peaks in which part of a peak coincides with part of another.

The stable resonant SAF reference layered structure 10 includes a polarizing magnetic layer 20 that forms an interface with the tunnel barrier layer 22. In the MTJ pillars shown in FIGS. 1A-1B, information is stored on the magnetic free layer 24 and is referenced to the polarizing magnetic layer 20 across the tunnel barrier layer 22. To increase the polarizing magnetic layer 20 stability, the polarizing magnetic layer 20 is coupled to a first magnetic reference layer 16 via a first coupling layer 18. The first magnetic reference layer 16 is antiferromagnetically exchange coupled to a second magnetic reference layer 12; a second coupling layer 14 is located between the first magnetic reference layer 16 and the second magnetic reference layer 12. Additional magnetic reference layers and coupling layers can be present in the MTJ pillars of the present application.

In FIGS. 1A-1B, the double-headed arrow that is present in the magnetic free layer 24 denotes that the orientation of the magnetization of that layer can be switched, while the single headed arrow present in each of the polarizing magnetic layer 20, the first magnetic reference layer 16 and the second magnetic reference layer 12 denotes that the orientation of the magnetization of those layers are fixed. The MTJ pillars shown in FIGS. 1A-1B are typically present in the back-end-of-the-line (BEOL) and are sandwiched between a top electrode (not shown) and a bottom electrode (also not shown). The bottom electrode is typically located on a surface of an electrically conductive structure (also not shown). The electrically conductive structure is embedded in an interconnect dielectric material layer (also not shown). Another interconnect dielectric material layer (also not shown) may embed the MTJ pillars shown in FIGS. 1A and 1B. Another electrically conductive structure (also not shown) can be located on the top electrode.

The MTJ pillars shown in FIGS. 1A-1B can be formed by first depositing a material stack containing each of the material layers present in the MTJ pillar, and thereafter subjecting the material stack to a patterning process. The deposition of the material stack can include chemical vapor deposition (CVD), plasma enhanced chemical vapor deposition (PECVD), physical vapor deposition (PVD) of sputtering. In some embodiments of the present application, a same deposition process can be used in forming each layer of the material stack. In other embodiments, at least two different deposition processes can be used in forming the material stack. The patterning of the material stack can include photolithography and etching. Etching can include at least one of reactive ion etching (RIE), ion beam etching (IBE) or plasma etching.

The MTJ pillar that is formed can have various shapes including, for example, cylindrical. The critical dimension (CD) of the MTJ pillar can vary and is not critical to the present application. In some embodiments, the CD of the MTJ pillar is equal to a CD of the bottom electrode. In other embodiments, the CD of the MTJ pillar is greater than a CD of the bottom electrode. In yet a further embodiment of the present application, the CD of the MTJ pillar is lesser than a CD of the bottom electrode.

The magnetic free layer 24 is composed of at least one magnetic material with a magnetization that can be changed in orientation relative to the magnetization orientation of the polarizing magnetic layer 20 present in the SAF reference layered structure 10. Exemplary magnetic materials for the magnetic free layer 24 include alloys and/or multilayers of cobalt (Co), iron (Fe), alloys of cobalt-iron (Co—Fe), nickel (Ni), alloys of nickel-iron (Ni—Fe), and alloys of cobalt-iron-boron (Co—Fe—B). The magnetic free layer 24 that can be employed in the present application can have a thickness from 1 nm to 3 nm; although other thicknesses for the magnetic free layer 24 can be used. The magnetic state of the magnetic free layer 24 can be switched to either up or down state by sending a current through the MTJ pillar. Polarized spin current is produced by the polarizing magnetic layer 20, exerting switching torque on the magnetic free layer 24.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators. In one embodiment, magnesium oxide is used as the material that provides the tunnel barrier layer 22. The thickness of tunnel barrier layer 22 can be from 0.5 nm to 1.5 nm; although other thicknesses for the tunnel barrier layer 22 can be used as long as the selected thickness provides a desired tunnel barrier resistance. The tunnel barrier layer 22 forms a first interface with the magnetic free layer 24 and a second interface, opposite the first interface, with the polarizing magnetic layer 20 of the stable resonant SAF reference layered structure 10.

The polarizing magnetic layer 20 is composed of a magnetic material that enhances the polarization of the spin torque current by enhancing coherent tunneling through its' interface with the tunnel barrier layer 22. Exemplary magnetic materials that can be used as the polarizing magnetic layer 20 include, but are not limited to, an alloy of cobalt-iron-boron (Co—Fe—B), an alloy of cobalt-iron (Co—Fe), iron (Fe) cobalt (Co) or any multilayered stack thereof. The perpendicular anisotropy of the polarizing magnetic layer 20 is set by its' interface with the tunnel barrier layer 22 and the thickness of the polarizing magnetic layer 20 itself. The polarizing magnetic layer 20 typically has a perpendicular anisotropy, $H_k$, from −1 kOe to 10 kOe. The polarizing magnetic layer 20 can have a thickness from 0.5 nm to 3 nm; although other thicknesses for the polarizing magnetic layer 20 can be used.

Both the first coupling layer 18 and the second coupling layer 14 can be composed of a non-magnetic metal-containing material such as, for example, tantalum (Ta), tungsten (W), ruthenium (Ru), iridium (Jr) or an alloy of tantalum-iron (Ta—Fe). In accordance with the present invention, the first coupling layer 18 is sandwiched between the polarizing magnetic layer 20 and the first magnetic reference layer 16, while the second coupling layer 14 is sandwiched between the first magnetic reference layer 16 and the second magnetic reference layer 12. Both the first coupling layer 18 and the second coupling layer 14 can have a thickness from 0.4 nm to 1 nm; although other thicknesses for both the first coupling layer 18 and the second coupling layer 14 can be used.

Both the first magnetic reference layer 16 and the second magnetic reference layer 12 have fixed magnetization. Both the first magnetic reference layer 16 and the second magnetic reference layer 12 can be composed of cobalt/nickel (Co/Ni), cobalt/platinum (Co/Pt), cobalt/palladium (Co/Pd), cobalt (Co), nickel (Ni), platinum (Pt), palladium (Pd) or any multilayered stack thereof. In some embodiments, the first magnetic reference layer 16 and the second magnetic reference layer 12 are composed of a compositionally same magnetic material. In other embodiments, the first magnetic reference layer 16 is composed of a magnetic material that is compositionally different from that of the second magnetic reference layer 12. The thickness of both the first magnetic reference layer 16 and the second magnetic reference layer 12 can be from 0.2 nm to 1 nm.

The first magnetic reference layer 16 typically has a perpendicular anisotropy, $H_k$, from 0 kOe to 10 kOe. In the present application, the perpendicular anisotropy of the first magnetic reference layer 16 substantially matches (within ±10%) the perpendicular anisotropy of the polarizing magnetic layer 20. By substantially matching the perpendicular anisotropy of the first magnetic reference layer 16 and the polarizing magnetic layer 20 the resonance frequency peaks of those layers will substantially match each other.

The second magnetic reference layer 12 typically has a perpendicular anisotropy, $H_k$, from 0 kOe to 10 kOe. In some embodiments of the present application, the perpendicular anisotropy of the second magnetic reference layer 12 substantially matches (within ±10%) the perpendicular anisotropy of both the first magnetic reference layer 16 and the polarizing magnetic layer 20. In such an embodiment, the resonance frequency peak of the polarizing magnetic layer 20 will substantially overlap the resonance frequency peak of both the first and second magnetic reference layers.

In some embodiments, and to increase overlap of the resonance frequency peaks of the polarizing magnetic layer 20 and the first magnetic reference layer 16, the first magnetic reference layer 16 can include a rare-earth element inserted therein. Rare-earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). In some embodiments, the rare-earth element insertion includes a discrete rare-earth element containing layer located within the first magnetic reference layer 16. In other embodiments, the rare-earth element insertion includes doping the first magnetic reference layer 16 with a rare-earth element. In some embodiments, and when a rare-earth element is present in the first magnetic reference layer 16, the first magnetic reference layer 16 containing the rare-earth element can have a damping value, α, of from 0.0001 to 1.

In some embodiments, the second magnetic reference layer 12 can include rare-earth element insertion. In some embodiments, both the first magnetic reference layer 16 and the second magnetic reference layer 12 include the rare-earth insertion. In some embodiments, and when a rare-earth element is present in the second magnetic reference layer 12, the second magnetic reference layer 12 containing the rare-earth element can have a damping value, α, of from 0.0001 to 1.

The stable resonant SAF reference layered structure 10 can be implemented into the two terminal magnetic tunnel junction fabrication by adjusting the first magnetic reference layer 16 material properties. In order to improve stability, the first magnetic reference layer 16 resonance frequency must be substantially matched to the polarizing magnetic layer 20. If the resonance frequency of the polarizing magnetic layer (ωPL) and the resonance frequency of the first magnetic reference layer (ωRL) are not close to equal, spin-current excitations are confined to the polarizing magnetic layer 20. This is conceptually shown in FIG. 2A as the magnetic moment vector processing around the rest state axis. Large enough spin-current excitation results in flipping of this polarizing magnetic layer 20. When the resonance frequencies are equal, the spin-current excitation is spread to the first magnetic reference layer 16; this is conceptually shown in FIG. 2B. The total energy deposited to the polarizing magnetic layer 20 is reduced resulting in a lower spin-current excitation of the polarizing magnetic layer 20.

The resonant frequency of the polarizing magnetic layer 20 and the first magnetic reference layer 16 depends linearly on perpendicular anisotropy energy. The perpendicular anisotropy of the first magnetic reference layer 16 is produced at the material interfaces. The total anisotropy energy generated at the interface is then distributed to the bulk of the polarizing magnetic layer 20, meaning that changing the thickness of the first magnetic reference layer 16 within the thickness range mentioned above can tune the total energy and resonant frequency. Optimization of these layers' thicknesses can achieve a matching condition for the resonant frequencies of the polarizing magnetic layer 20 and the first magnetic reference layer 16.

There is a degree of resonant frequency mismatch between the polarizing magnetic layer 20 and the first magnetic reference layer 16 where the desired effect can be seen.

Figure 3B:
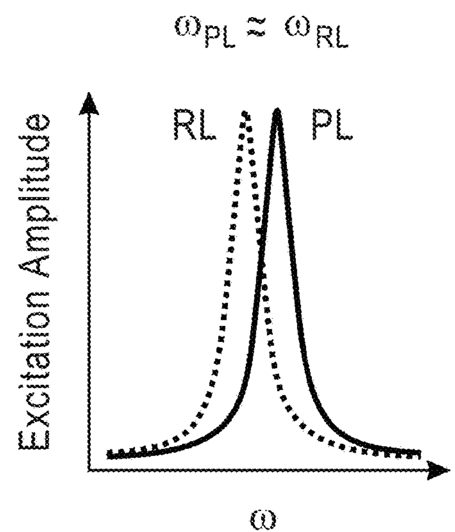
FIG. 3B is a graph of excitation amplitude vs. frequency ($\omega$) when the resonance frequency of the polarizing magnetic layer ($\omega_{PL}$) is substantially equal to the resonance frequency of the first magnetic reference layer ($\omega_{RL}$).

The excitation frequency of a processing magnetic moment is not a single discreet value. Rather, it covers a range of frequencies with the width determined by the magnetic damping in the material. Below the excitation amplitude as a function of frequency is represented. When the two resonance frequencies are separated, there is no overlap of the two peaks; see, for example, FIG. 3A. When the resonance frequencies are close, the peaks overlap; see, for example, FIG. 3B. In this situation there can be resonance between the polarizing magnetic layer 20 and the first magnetic reference layer 16.

Figure 4:
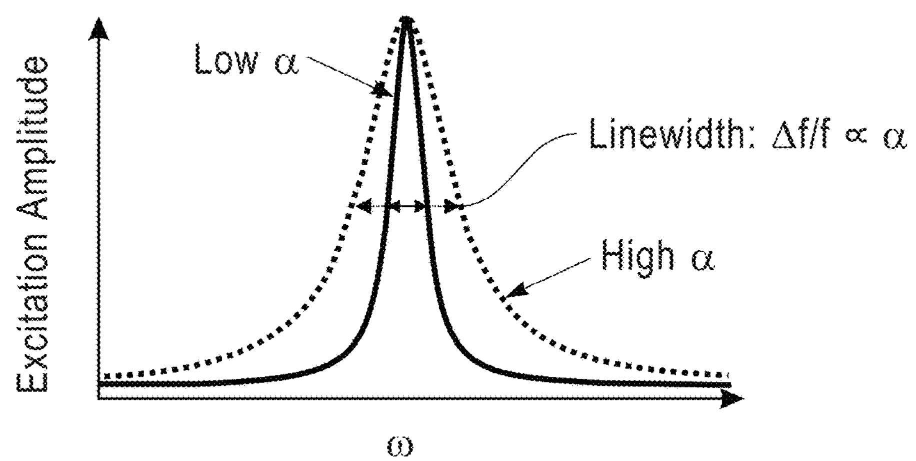
FIG. 4 is a graph of excitation amplitude vs. frequency ($\omega$) for an embodiment in which the magnetic damping characteristics of the first magnetic reference layer is increased so as to increase the width of the resonance peak allowing for a larger overlap of the two peaks.

The requirement for the present application to operate is to have the polarizing magnetic layer's resonance line significantly overlap that of the rest of the first magnetic reference layer's line width. In addition to the tuning of the resonance center frequency, one may also engineer the first magnetic reference layer 16 to increase magnetic damping characteristics. In one embodiment, and as mentioned above, increased magnetic damping of the first magnetic reference layer 16 can be obtained by rare-earth element insertion into the first magnetic reference layer 16. In the simple colinear geometry, the linewidth of ferromagnetic resonance is directly proportional to the magnetic damping constant of the material used. As is shown in FIG. 4, when the damping a is increased, the width of the resonance peak increases allowing for a larger range of overlap.

Numerical simulations using the macrospin model are used to demonstrate the effectiveness of this design. The model is based on the Landau-Lifshitz-Gilbert equation:

$$\frac{dn_{m1}}{dt} = \gamma[H_{k1}(n_{k1}\cdot n_{m1})n_{k1} + H_a]\times n_{m1} + \alpha_1 n_{m1}\times\frac{dn_{m1}}{dt} + \left(\frac{J_s}{M_{s1}t_1}\right)n_{m1}\times(n_{m1}\cdot n_{m2}),$$

$$\frac{dn_{m2}}{dt} = \gamma\left[H_{k2}(n_{k2}\cdot n_{m2})n_{k2} + \frac{E_{ex,23}}{M_{s2}t_2}n_{m3} + H_a\right]\times n_{m2} + \alpha_2 n_{m2}\times\frac{dn_{m2}}{dt} - \left(\frac{J_s}{M_{s2}t_2}\right)n_{m2}\times(n_{m2}\cdot n_{m1}),$$

wherein $n_{m1}$ is the magnetic free layer direction vector and $n_{m2}$ is the polarizing magnetic layer direction vector. $J_s$ represents the spin current, $H_k$ the perpendicular anisotropy field, α damping, t layer thickness, and $M_s$ saturation magnetization. $E_{ex}$ represents the interlayer exchange coupling energy. Additional equations for the first and second magnetic reference layers are included but not shown here.

First, a structure (in accordance with the prior art) was simulated where the magnetic reference layer and the polarizing magnetic layer have different resonant frequencies (different $H_k$) with the following parameters as shown in Table 1:

TABLE 1

| Layer | $H_k$ (kOe) | Damping, α | $M_S$ (emu/cm$^3$) | T (nm) |
|---|---|---|---|---|
| Magnetic Free layer | 4 | 0.005 | 600 | 1.5 |
| Polarizing Magnetic Layer | 1 | 0.012 | 1000 | 1 |
| First Magnetic Reference Layer | 5 | 0.03 | 1000 | 2.5 |
| Second Magnetic Reference Layer | 5 | 0.03 | 1000 | 3 |

Figure 5A:
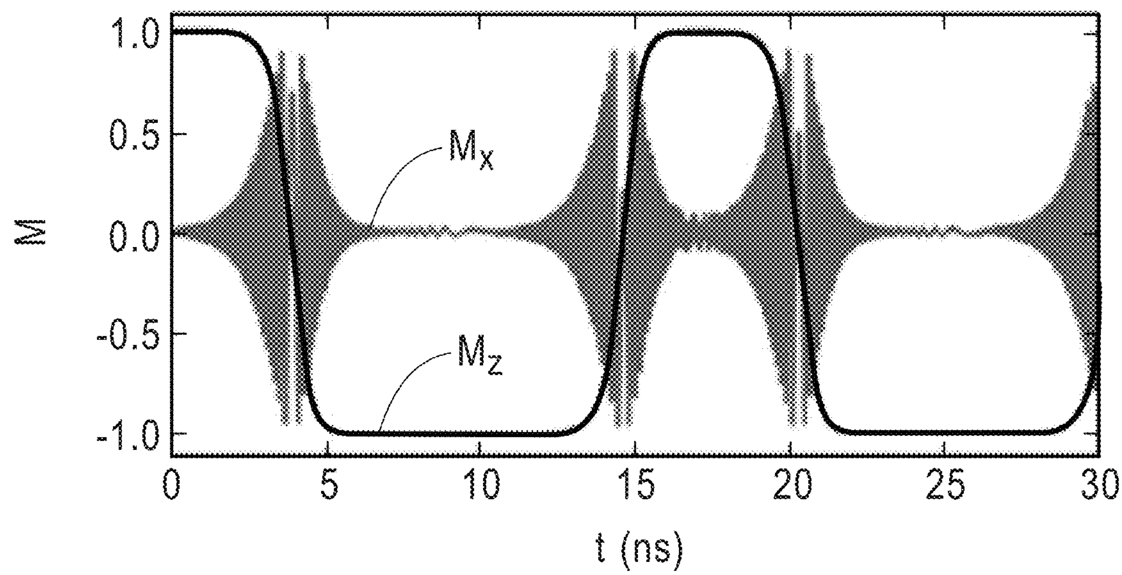
FIG. 5A is a plot showing the magnetization direction, M, as a function of time, ns, for a magnetic free layer in a prior art MTJ pillar in which the resonance frequencies of the polarizing magnetic layer and the magnetic reference layers do not match.
Figure 5B:
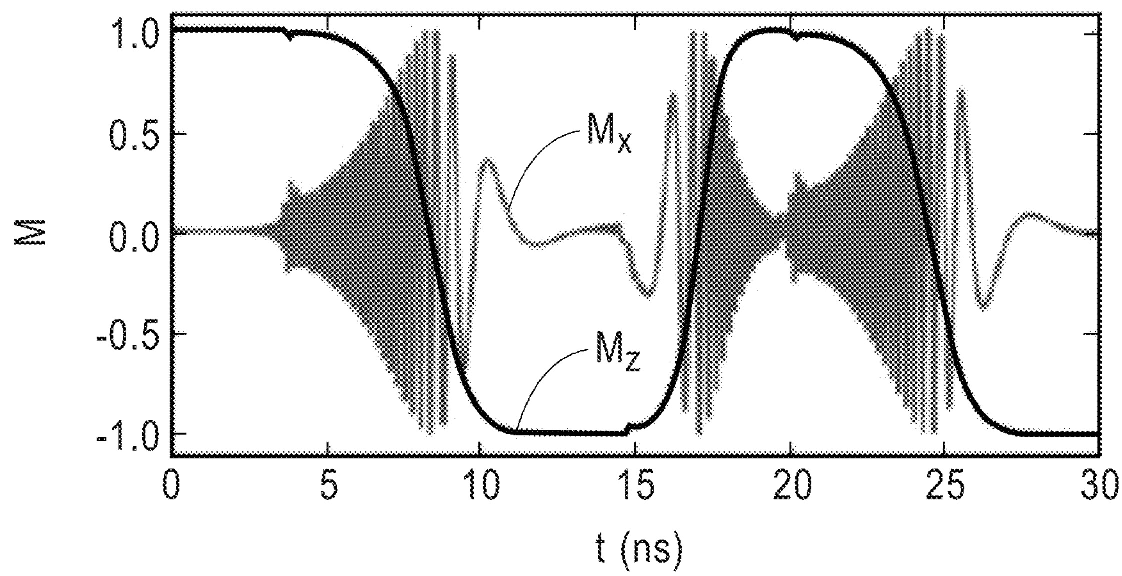
FIG. 5B is plot showing the magnetization direction, M, as a function of time, ns, for a polarizing free layer in a prior art MTJ pillar in which the resonance frequencies of the polarizing magnetic layer and the magnetic reference layers do not match.

Reference is now made to FIGS. 5A-5B which are plots showing the magnetization direction, M, as a function of time, ns, for the magnetic free layer (FIG. 5A) and polarizing magnetic layer (FIG. 5B) in a prior art MTJ pillar in which the resonance frequencies of the polarizing magnetic layer and the magnetic reference layers do not match; FIGS. 5A-5B are based on the parameters shown in Table 1 above. The z component of the magnetization, $M_z$, determines the state the device is in. In this simulation, the magnetic free layer switches after a few nanoseconds. Shortly after, excitations begin in the polarizing magnetic layer and it subsequently flips introducing a write error.

Next, another structure (in accordance with the present application) was simulated where the magnetic reference layer and the polarizing magnetic layer have substantially matching resonant frequencies (different $H_k$) with the following parameters as shown in Table 2:

TABLE 2

| Layer | $H_k$ (kOe) | Damping, α | $M_S$ (emu/cm$^3$) | T (nm) |
|---|---|---|---|---|
| Magnetic Free layer | 4 | 0.005 | 600 | 1.5 |
| Polarizing Magnetic Layer | 1 | 0.012 | 1000 | 1 |
| First Magnetic Reference Layer | 1.1 | 0.03 | 1000 | 2.5 |
| Second Magnetic Reference Layer | 1.1 | 0.03 | 1000 | 3 |

Figure 6A:
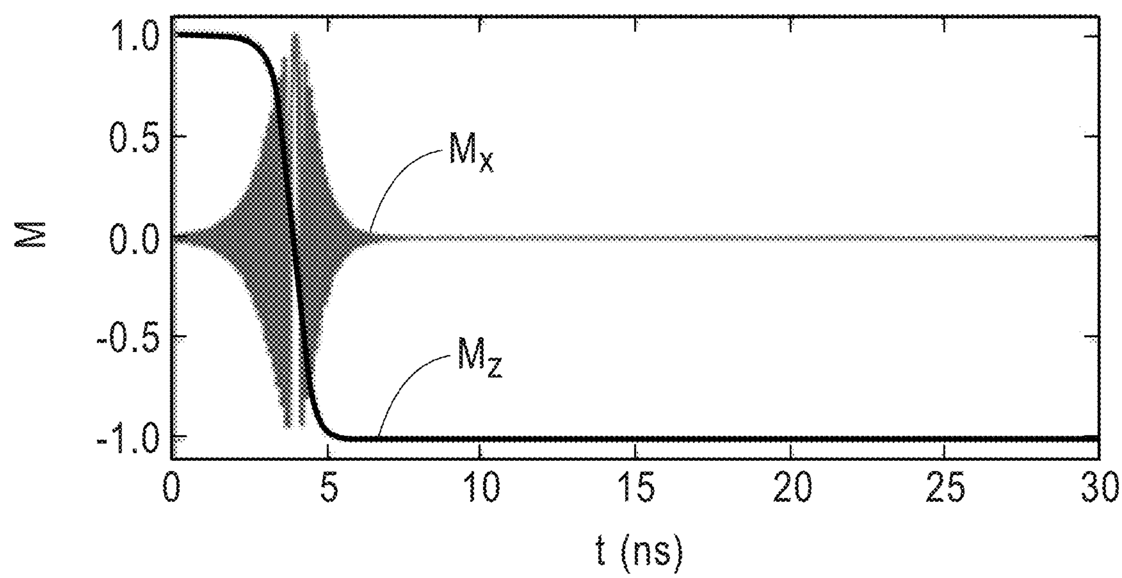
FIG. 6A is a plot showing the magnetization direction, M, as a function of time, ns, for a magnetic free layer in an inventive MTJ pillar in which the resonance frequencies of the polarizing magnetic layer and the magnetic reference layers substantially match.
Figure 6B:
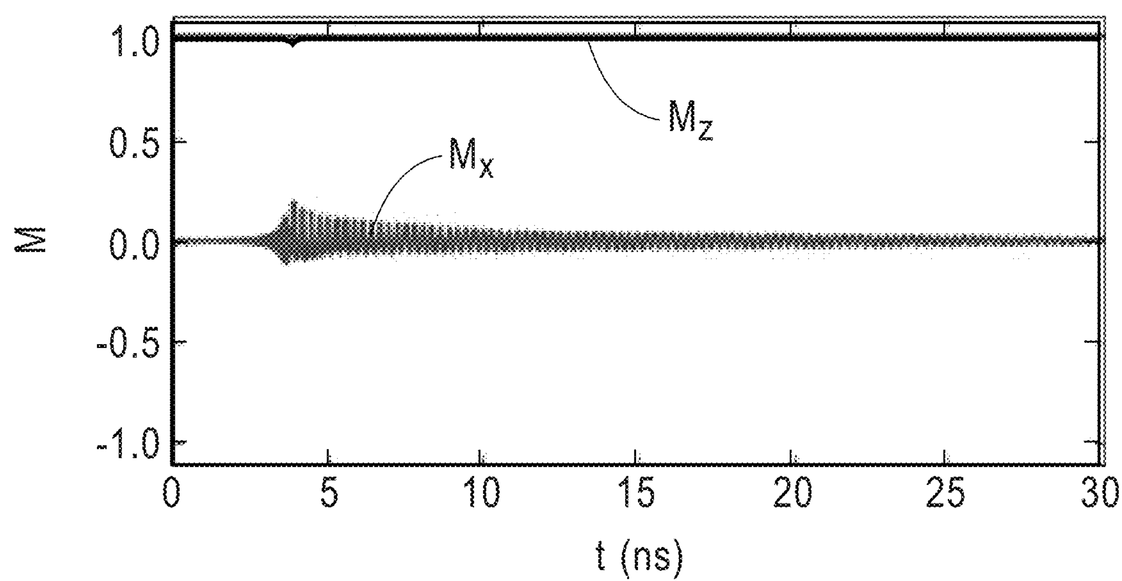
FIG. 6B is plot showing the magnetization direction, M, as a function of time, ns, for a polarizing free layer in an inventive MTJ pillar in which the resonance frequencies of the polarizing magnetic layer and the magnetic reference layers substantially match.

Reference is now made to FIGS. 6A-6B which are plots showing the magnetization direction, M, as a function of time, ns, for the magnetic free layer (FIG. 6A) and polarizing magnetic layer (FIG. 6B) in a MTJ pillar in which the resonance frequencies of the polarizing magnetic layer and the magnetic reference layers substantially match; FIGS. 6A-6B are based on the parameters shown in Table 2 above. In this simulation, switching of the magnetic free layer (FIG. 6A) occurred without errors. When the resonant frequencies of the polarizing magnetic layer (FIG. 6B) and at least the first magnetic reference layer are matched (in this simulation the resonant frequencies of the polarizing magnetic layer and the first and second magnetic reference all substantially match), current driven excitations of the polarizing magnetic layer are decreased. The magnetic reference layers that are coupled begin to have excitations as well, but with decreased amplitude for the polarizing magnetic layer. It is this spread of energy to the entire structure that improves overall stability. Further tuning the material parameters, such as damping, can stabilize the structure further.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic memory device comprising:

a magnetic tunnel junction (MTJ) pillar including a tunneling barrier layer sandwiched between a synthetic antiferromagnet (SAF) reference layered structure, and a magnetic free layer, wherein the SAF reference layered structure comprises a polarizing magnetic layer exchange coupled to a stack of magnetic reference layers including a first magnetic reference layer and a second magnetic reference layer, wherein the polarizing magnetic layer forms an interface with the tunnel barrier layer and has a resonance frequency peak that substantially overlaps a resonance frequency peak of at least the first magnetic reference layer.

2. The magnetic memory device of claim 1, wherein the resonance frequency peak of the polarizing magnetic layer substantially overlaps the resonance frequency peaks of both the first and second magnetic reference layers.

3. The magnetic memory device of claim 1, wherein the first magnetic reference layer is antiferromagnetically exchange coupled to the second magnetic reference layer.

4. The magnetic memory device of claim 3, wherein a first coupling layer separates the polarizing magnetic layer from the first magnetic reference layer, and a second coupling layer separates the first magnetic reference layer from the second magnetic reference layer.

5. The magnetic memory device of claim 1, wherein the MTJ pillar is a top pinned MTJ pillar having the magnetic free layer located above the SAF reference layered structure.

6. The magnetic memory device of claim 1, wherein the MTJ pillar is a bottom pinned MTJ pillar having the magnetic free layer located beneath the SAF reference layered structure.

7. The magnetic memory device of claim 1, wherein the polarizing magnetic layer is composed of an alloy of cobalt-iron-boron (Co—Fe—B), an alloy of cobalt-iron (Co—Fe), iron (Fe), cobalt (Co) or multilayered stacks thereof, and has a thickness from 0.5 nm to 3 nm.

8. The magnetic memory device of claim 1, wherein the first magnetic reference layer and the second magnetic reference layer are composed of cobalt/nickel (Co/Ni), cobalt/platinum (Co/Pt), cobalt/palladium (Co/Pd), cobalt (Co), nickel (Ni), platinum (Pt), palladium (Pd) or multilayered stacks thereof, and have a thickness from 0.2 nm to 1 nm.

9. The magnetic memory device of claim 7, wherein the first magnetic reference layer includes a rare-earth element inserted therein, and has a damping value of from 0.0001 to 1.

10. The magnetic memory device of claim 1, wherein the polarizing magnetic layer has a perpendicular anisotropy, $H_k$, from −1 kOe to 10 kOe, and the first magnetic reference layer has a perpendicular anisotropy, $H_k$, from 0 kOe to 10 kOe, and the perpendicular anisotropy of the polarizing magnetic layer substantially matches the perpendicular anisotropy of the first magnetic reference layer.

11. A magnetic memory device comprising:

a magnetic tunnel junction (MTJ) pillar including a tunneling barrier layer sandwiched between a synthetic antiferromagnet (SAF) reference layered structure, and a magnetic free layer, wherein the SAF reference layered structure comprises a polarizing magnetic layer exchange coupled to a stack of magnetic reference layers including a first magnetic reference layer and a second magnetic reference layer, wherein the polarizing magnetic layer has a perpendicular anisotropy that substantially matches a perpendicular anisotropy of the first magnetic reference layer.

12. The magnetic memory device of claim 11, wherein the perpendicular anisotropy of both the polarizing magnetic layer and the first magnetic reference layer substantially matches a perpendicular anisotropy of the second magnetic reference layer.

13. The magnetic memory device of claim 11, wherein the first magnetic reference layer is antiferromagnetically exchanged coupled to the second magnetic reference layer.

14. The magnetic memory device of claim 13, wherein a first coupling layer separates the polarizing magnetic layer from the first magnetic reference layer, and a second coupling layer separates the first magnetic reference layer from the second magnetic reference layer.

15. The magnetic memory device of claim 11, wherein the MTJ pillar is a top pinned MTJ pillar having the magnetic free layer located above the SAF reference layered structure.

16. The magnetic memory device of claim 11, wherein the MTJ pillar is a bottom pinned MTJ pillar having the magnetic free layer located beneath the SAF reference layered structure.

17. The magnetic memory device of claim 11, wherein the polarizing magnetic layer is composed of an alloy of cobalt-iron-boron (Co—Fe—B), an alloy of cobalt-iron (Co—Fe), iron (Fe), cobalt (Co) or multilayered stacks thereof, and has a thickness from 0.5 nm to 3 nm.

18. The magnetic memory device of claim 11, wherein the first magnetic reference layer and the second magnetic reference layer are composed of cobalt/nickel (Co/Ni), cobalt/platinum (Co/Pt), cobalt/palladium (Co/Pd), cobalt (Co), nickel (Ni), platinum (Pt), palladium (Pd) or multilayered stacks thereof, and have a thickness from 0.2 nm to 1 nm.

19. The magnetic memory device of claim 18, wherein the first magnetic reference layer includes a rare-earth element inserted therein, and has a damping value of from 0.0001 to 1.

20. The magnetic memory device of claim 11, wherein the polarizing magnetic layer has a perpendicular anisotropy, $H_k$, from −1 kOe to 10 kOe, and the first magnetic reference layer has a perpendicular anisotropy, $H_k$, from 0 kOe to 10 kOe.

* * * * *